(12) United States Patent
Shin et al.

(10) Patent No.: US 7,754,586 B2
(45) Date of Patent: Jul. 13, 2010

(54) METHOD OF SURFACE TREATING A PHASE CHANGE LAYER AND METHOD OF MANUFACTURING A PHASE CHANGE MEMORY DEVICE USING THE SAME

(75) Inventors: Woong-chul Shin, Yongin-si (KR);
Kyung-sang Cho, Yongin-si (KR);
Jae-young Choi, Yongin-si (KR);
Youn-seon Kang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 81 days.

(21) Appl. No.: 11/907,472

(22) Filed: Oct. 12, 2007

(65) Prior Publication Data
US 2008/0090326 A1    Apr. 17, 2008

(30) Foreign Application Priority Data
Oct. 13, 2006 (KR) .................. 10-2006-0100009

(51) Int. Cl.
*H01L 21/322* (2006.01)
(52) U.S. Cl. ..................................................... 438/471
(58) Field of Classification Search ................. None
See application file for complete search history.

(56) References Cited

U.S. PATENT DOCUMENTS

| | | | |
|---|---|---|---|
| 5,985,519 A * | 11/1999 | Kakamu et al. ............. 430/313 |
| 6,512,241 B1 * | 1/2003 | Lai ................................ 257/4 |
| 6,569,705 B2 * | 5/2003 | Chiang et al. ................. 438/95 |
| 7,138,155 B2 * | 11/2006 | Itoh et al. ...................... 427/8 |
| 7,226,651 B2 * | 6/2007 | Hayashida et al. .......... 428/64.4 |
| 2007/0012906 A1 * | 1/2007 | Kim et al. ....................... 257/3 |
| 2007/0131922 A1 * | 6/2007 | Lung .............................. 257/5 |

\* cited by examiner

*Primary Examiner*—Charles D Garber
*Assistant Examiner*—Andre' C Stevenson
(74) *Attorney, Agent, or Firm*—Harness, Dickey & Pierce, PLC (57) ABSTRACT

A method of surface treating a phase change layer may include, before forming the phase change layer, forming a coating layer on a surface of a bottom layer on which the phase change layer is to be formed, wherein the coating layer has a chemical structure for contributing to the adherence of an alkyl radical to the surface of the bottom layer. After forming the coating layer, the phase change layer may be formed using an atomic layer deposition (ALD) method.

17 Claims, 9 Drawing Sheets

Sb(iPr)₃

FIG. 13

Te(iPr)₂

METHOD OF SURFACE TREATING A PHASE CHANGE LAYER AND METHOD OF MANUFACTURING A PHASE CHANGE MEMORY DEVICE USING THE SAME

PRIORITY STATEMENT

This application claims priority under 35 U.S.C. §119 to Korean Patent Application No. 10-2006-0100009, filed on Oct. 13, 2006, in the Korean Intellectual Property Office (KIPO), the entire contents of which are incorporated herein by reference.

BACKGROUND

1. Field

Example embodiments relate to a method of manufacturing a semiconductor memory device. Other example embodiments relate to a method of surface treating a phase change layer and a method of manufacturing a phase change memory device.

2. Description of the Related Art

A phase change material is a material that may switch between a crystalline state and an amorphous state with changes in temperature. The crystalline or amorphous state of the phase change material is reversible. For example, the phase change material may be change from the crystalline state to the amorphous state, or from the amorphous state to the crystalline state. The resistance of the phase change material in the crystalline state may be lower than the resistance of the phase change material in the amorphous state. Therefore, there are clearly two different states of resistance in phase change material.

A phase change memory device (may be referred to as a PRAM) may be a memory device using the above-described phase change material as a storage node.

In general, a PRAM may include a transistor and a storage node that is electrically connected to the transistor and may include a phase change material. The PRAM may function as a memory by utilizing the resistance difference between the amorphous and crystalline states of the phase change material. Presently, various types of phase change materials that may be used in PRAMs are known, for example, a GeSbTe (GST) alloy.

Like other memory devices, the PRAM may also reduce its operating current. A current for switching the phase change material from the crystalline state to the amorphous state in a PRAM may be referred to as a reset current, and a current for switching the phase change material from the amorphous state to the crystalline state may be referred to as a set current. The temperature of the phase change material for switching the phase change material in the crystalline state to the amorphous state should be greater than the melting point of the phase change material. Thus, the reset current may be a current for increasing the temperature of the phase change material above the melting point.

In order to switch the phase change material from the amorphous state to the crystalline state, the temperature of the phase change material may be increased above a predetermined or given temperature, but the predetermined or given temperature may be lower than the melting point of the phase change material. Accordingly, the reset current may be higher than the set current. The transistor used in the PRAM may be limited depending on the amount of the reset current. Even to reduce the power consumption and to increase the integration degree of the PRAM, the reset current of the PRAM should be reduced. Also, the reset current should be greater than the set current.

A GeSbTe (GST) layer used widely as a phase change material for PRAMs may be formed using a physical vapor deposition (PVD) method. However, when a GST layer is formed using a PVD method, the growth of the GST layer may be difficult to control, and the deposition speed of the GST layer may be lower. Also, the densification of the GST layer may be decreased. Such problems may be overcome to some degree by forming a GST layer using an atomic layer deposition (ALD) method. However, even when using an ALD method for forming a GST layer, the following problems may occur.

For example, a GST layer may not be formed only on a bottom electrode contact (BEC) but also on a silicon oxide layer around the BEC. An organic metal compound may be used as a source material for a GST layer to form a GST layer. The organic metal compound may have an alkyl radical. Because the organic metal compound may not be easily absorbed on a silicon oxide layer at a relatively low temperature, the thickness of the GST layer may not be constant, and the step coverage of the GST layer may be decreased.

SUMMARY

Example embodiments provide a method of surface treating a phase change layer and a method of manufacturing a phase change memory device that secures constant thickness and improved step coverage of a phase change layer and reducing the reset current.

According to example embodiments, a method of surface treating a phase change layer may include, before forming the phase change layer, forming a coating layer on a surface of a bottom layer on which the phase change layer is to be formed, wherein the coating layer may have a chemical structure for contributing to the adherence of an alkyl radical to the surface of the bottom layer.

The coating layer may be formed using a dip coating method or a spin coating method. The coating layer may be formed using an ALD method. The coating layer may be formed using a material selected from the group of materials represented by $(alkyl)_x(OR)_y(Cl)_z Si$ ($x+y+z=4$, $y \geq 1$) as a reagent. The reagent may be one selected from the group consisting of diethyldiethoxysilane, diisopropyldimethoxysilane, and diisobutyldimethoxysilane.

The coating layer may be formed as one atomic layer. The method may include, before forming the coating layer, forming a via hole in the bottom layer, and filling a conductive plug in the via hole. The method may further include forming a via hole in the bottom layer before forming the coating layer; wherein forming the phase change layer includes filling the phase change layer in the via hole in the bottom layer coated with the coating layer. The method may further comprise removing the phase change material layer formed on an upper surface of the bottom layer.

According to example embodiments, a method of manufacturing a phase change memory device may include forming a bottom electrode on a first insulating interlayer, forming a second insulating interlayer, covering the bottom electrode, on the first insulating interlayer, exposing an upper surface of the bottom electrode by forming a via hole in the second insulating interlayer, forming a bottom electrode contact (BEC) layer in order to fill the via hole, performing the method of surface treating the phase change layer according to example embodiments, and sequentially forming the phase change layer and an upper electrode on the upper surface of the second insulating interlayer.

The method may further comprise sequentially stacking a gate insulating layer and a gate electrode on a region of a substrate, and ion-injecting conductive impurities into the gate electrode to form first and second impurity regions, wherein the substrate, the first and second impurity regions, and the gate electrode form a field effect transistor (FET). The method also may comprise forming the first insulating interlayer to cover the field effect transistor on the substrate, exposing the first or second impurity region by forming a contact hole in the first insulating interlayer, and forming a conductive plug in order to fill the contact hole, wherein the bottom electrode covers an exposed upper surface of the conductive plug.

Forming the phase change layer may include using an atomic layer deposition (ALD) method. Forming the phase change layer may further comprise supplying at least one of a plurality of source materials of the phase change layer, supplying a first purge gas, supplying a reaction gas, and supplying a second purge gas. The reaction gas may be $H_2$ gas or plasma. The source materials may include precursors containing Ge and an alkyl group, precursors containing Sb and an alkyl group, and precursors containing Te and an alkyl group. The conductive impurities of the first and second impurity regions may be opposite in polarity to those of the impurities doped in the substrate.

According to example embodiments, the thickness of the phase change layer may be constant regardless of the structure of the lower layer, and improved step coverage may be obtained. The reset current may be reduced, thereby increasing the integration degree of the PRAM.

BRIEF DESCRIPTION OF THE DRAWINGS

Example embodiments will be more clearly understood from the following detailed description taken in conjunction with the accompanying drawings. FIGS. 1-17 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. The thicknesses of layers or region illustrated in the drawings are exaggerated for clarity. Example embodiments may, however, be embodied in many different forms and should not be construed as limited to the example embodiments set forth herein. Rather, these example embodiments are provided so that this disclosure will be thorough and complete, and will fully convey the scope of example embodiments to those skilled in the art.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
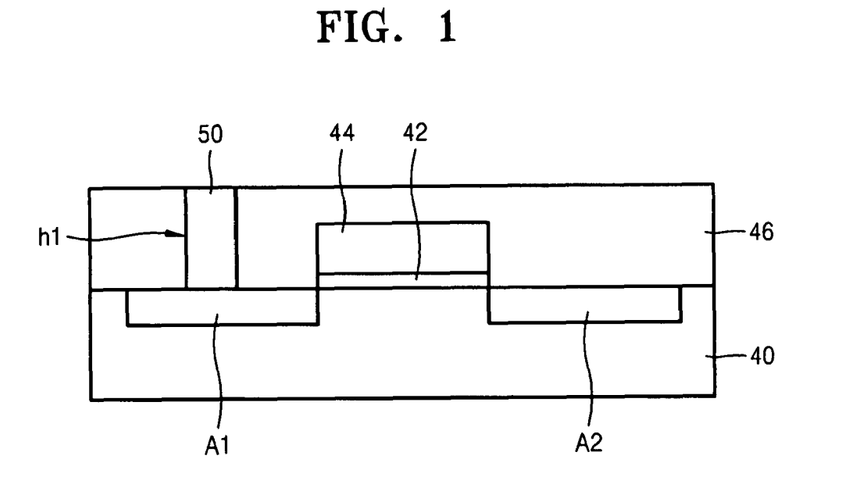
FIGS. 1-3 are cross-sectional views illustrating a method of manufacturing a phase change memory device according to example embodiments.
Figure 2:
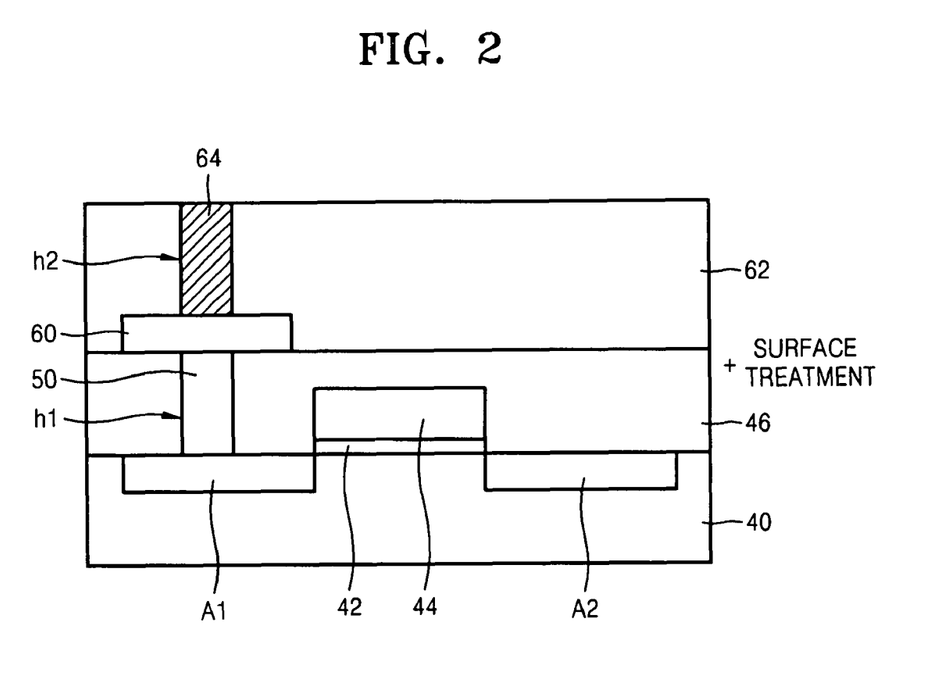
Figure 3:
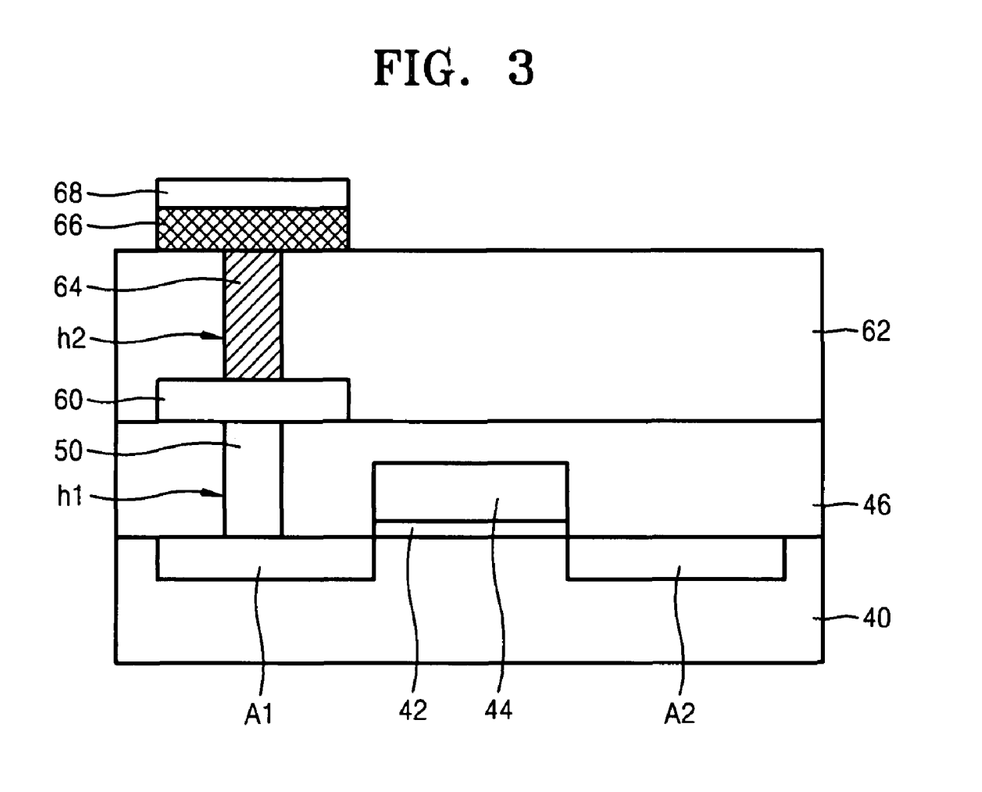

FIGS. 1-3 are cross-sectional views illustrating a method of manufacturing a phase change memory device according to example embodiments. Referring to FIG. 1, a gate insulating layer 42 and a gate electrode 44 may be sequentially stacked on a given region of a substrate 40. Conductive impurities may be ion-injected into the substrate 40 between a field oxide layer (not shown) defining an active region and the gate electrode 44 to form first and second impurity regions A1 and A2. The first and second impurity regions A1 and A2 may be separated by the gate electrode 44. The conductive impurities at the first and second impurity regions A1 and A2 may be opposite in polarity to those of the impurities doped in the substrate 40. For example, when the substrate 40 is a p-type substrate, the conductive impurities at the first and second impurity regions A1 and A2 may be n-type impurities.

The first and second impurities regions A1 and A2 may have various shapes. One of the first and second impurities regions A1 and A2, for example, the first impurity region A1 may be a source region, and the other one may be a drain region. The substrate 40, the first and second impurity regions A1 and A2, and the gate electrode 44 may form a field effect transistor (FET) (hereinafter referred to as a transistor). A first insulating interlayer 46 covering the transistor may be formed on the substrate 40. A contact hole h1 exposing the first impurity region A1 may be formed in the first insulating interlayer 46. The contact hole h1 may be formed on a position exposing the second impurity region A2 instead of the first impurity region A1. The contact hole h1 may be filled with a conductive plug 50.

Referring to FIG. 2, a bottom electrode 60, covering an exposed upper surface of the conductive plug 50, may be formed on the first insulating interlayer 46. The bottom electrode 60 also may function as a pad. A second insulating interlayer 62, covering the bottom electrode 60, may be formed on the first insulating interlayer 46. The second insulating interlayer 62 may be formed of silicon oxide ($SiO_2$). The second insulating interlayer 62 may be formed of the same material as the first insulating interlayer 46. A via hole h2, exposing an upper surface of the bottom electrode 60, may be formed in the second insulating interlayer 62. Then, the via hole h2 may be filled with a bottom electrode contact (BEC) layer 64. The BEC layer 64 may be formed of a conductive plug. The via hole h2 may be filled with the BEC layer 64, and the upper surface of the second insulating interlayer 62, on which a phase change layer is to be formed, may be treated using a predetermined or given reagent. The surface treatment may contribute to the adherence of a source material of the phase change layer to the second insulating interlayer 62 when the phase change layer is stacked. The surface treatment process may be performed using a dip coating method and/or a spin coating method.

The upper surface of the second insulating interlayer 62 may be coated using the reagent during the surface treatment process using the dip coating method and/or the spin coating method. The reagent may be relatively thinly coated, for example, coated so as to form one atomic layer of the reagent. By the surface treatment, a coating layer (not shown) may be formed on the upper surface of the second insulating interlayer 62. The reagent may be a material group represented by $(alkyl)_x(OR)_y(Cl)_zSi$. The suffixes x, y, and z in the material group may satisfy the equation, $x+y+z=4$ ($y \geq 1$). The reagent may be, for example, one of diethyldiethoxysilane, diisopropyldimethoxysilane, and diisobutyldimethoxysilane.

Figure 5:
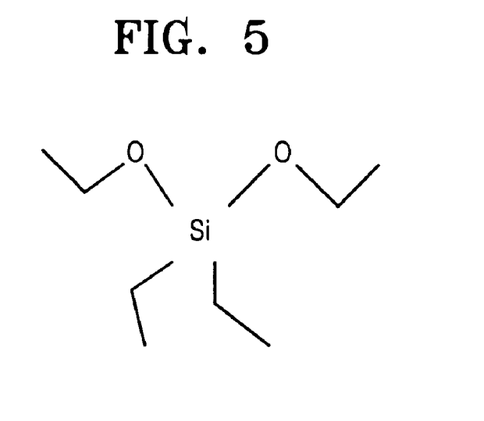
FIGS. 5-7 are diagrams illustrating the chemical structure of reagents used for surface treatment of a bottom layer on which a phase change layer is to be formed in the method of manufacturing a phase change memory device illustrated in FIGS. 1-3, according to example embodiments.
Figure 6:
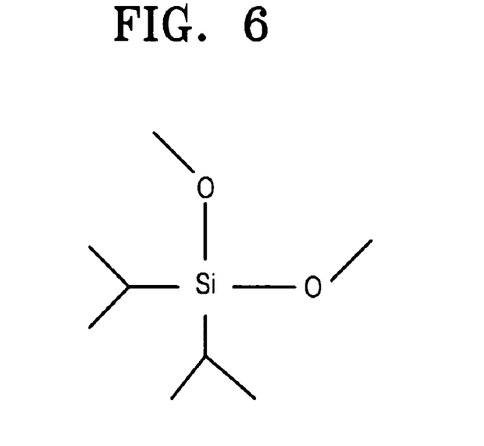
Figure 7:
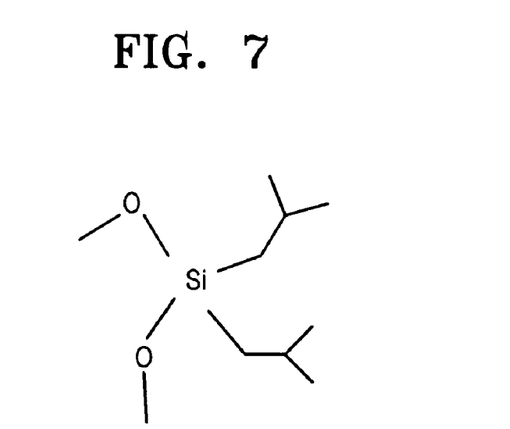

FIG. 5 illustrates the chemical structure of diethyldiethoxysilane, FIG. 6 illustrates the chemical structure of diisopropyldimethoxysilane, and FIG. 7 illustrates the chemical structure of diisobutyldimethoxysilane. The reaction between the second insulating interlayer 62 formed of $SiO_2$ and the reagent may be represented by the reaction formula below.

SiOR+SiOH→Si—O—Si+ROH        [Reaction formula]

Wherein, R denotes a methyl or ethyl group.

Figure 8:
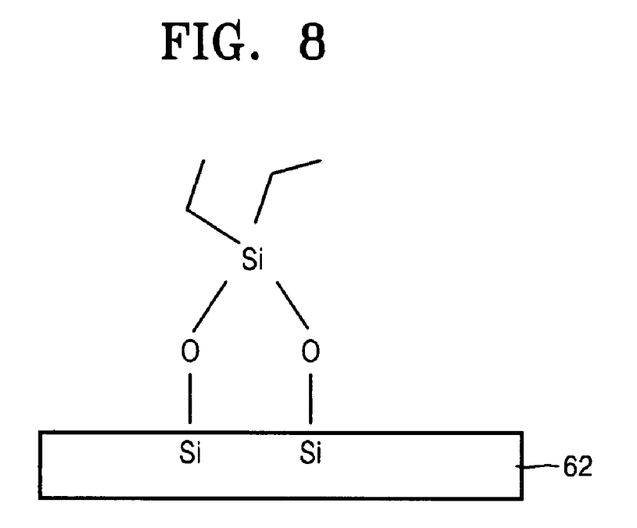
FIGS. 8-10 are diagrams illustrating the chemical structure of the bottom layer, the surface of which was treated by the reagents in FIGS. 5-7 according to example embodiments.
Figure 9:
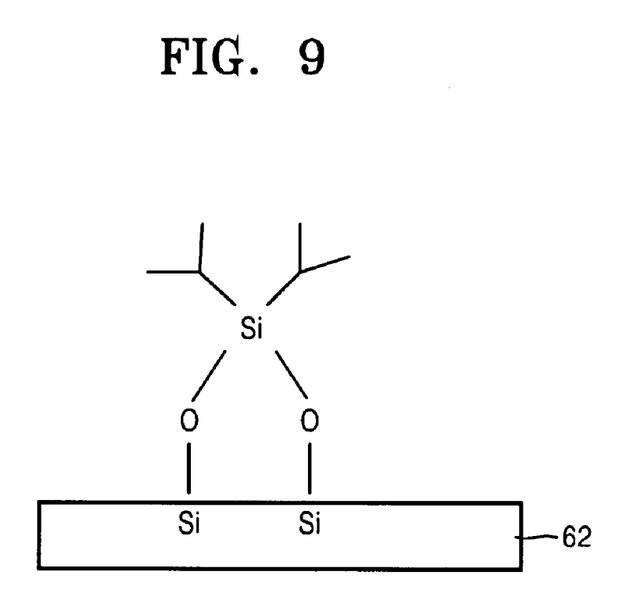
Figure 10:
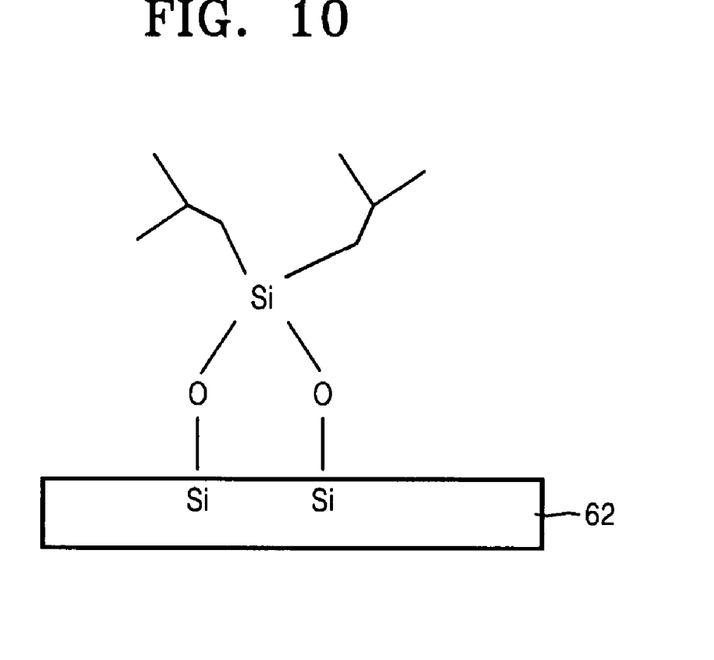

FIGS. 8-10 illustrate the state of the upper surface of the second insulating interlayer 62 after surface-treating the upper surface of the second insulating interlayer 62 using the above reagent. FIG. 8 illustrates the state of the upper surface of the second insulating interlayer 62 when diethyldiethoxysilane is used as the reagent, FIG. 9 illustrates when diisopropyldimethoxysilane is used as the reagent, and FIG. 10 illustrates when diisobutyldimethoxysilane is used as the reagent.

Referring to FIGS. 8-10, the reagent may react with the upper surface of the second insulating interlayer 62, which may be formed of $SiO_2$, and may form a structure that may readily absorb an alkyl radical on the upper surface of the second insulating interlayer 62. The coating process of the reagent on a bottom layer, for example, the upper surface of the second insulating interlayer 62, on which a phase change layer is to be formed, may be replaced by an atomic layer deposition (ALD) method. When the reagent is deposited using an ALD method, the reagent may be formed as one atomic layer.

As described above, the upper surface of the second insulating interlayer 62 may be surface-treated using the reagent, and then as illustrated in FIG. 3, a phase change layer 66 and an upper electrode 68 may be sequentially formed on the upper surface of the second insulating interlayer 62. The phase change layer 66 may be formed to cover the upper surface of the BEC layer 64. The phase change layer 66 may be formed of GeSbTe (GST) or another phase change material. The phase change layer 66 may be formed using an ALD method.

Figure 4:
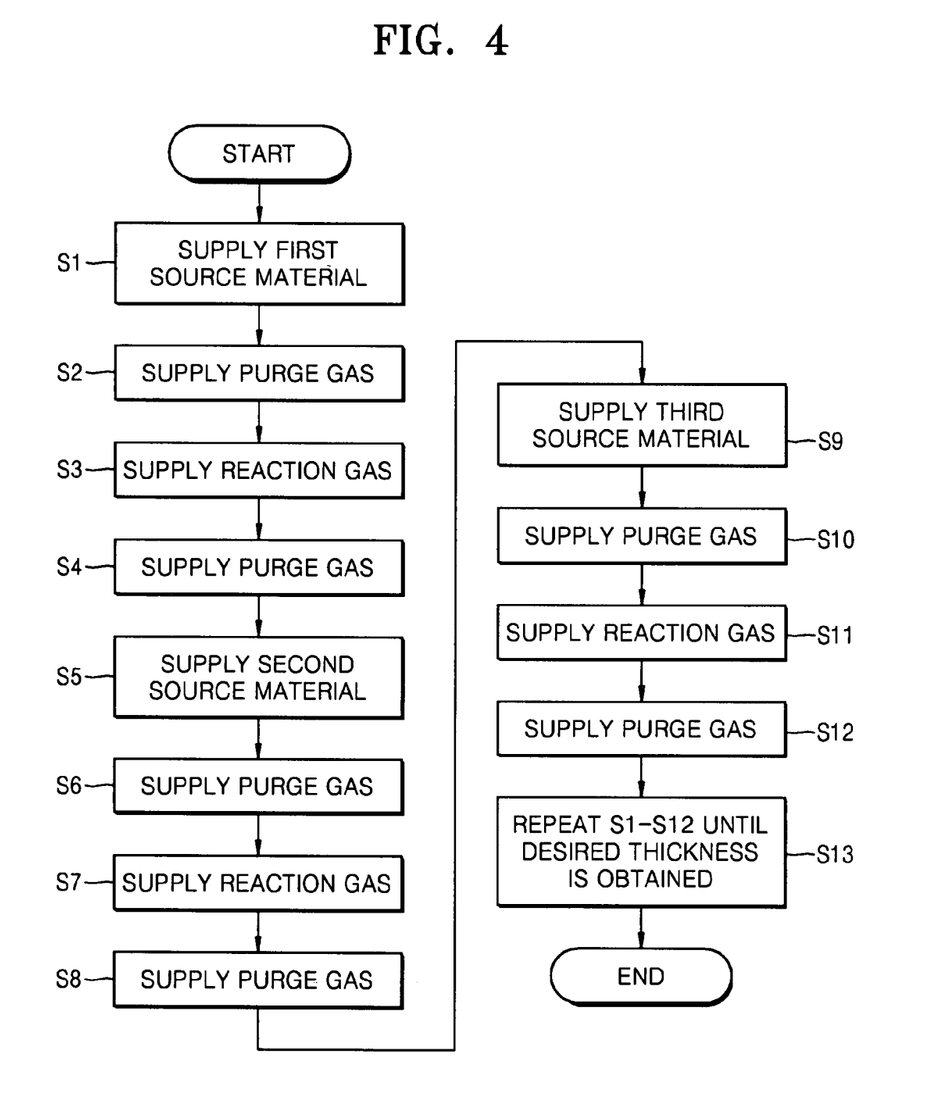
FIG. 4 illustrates a process of forming a phase change layer using an atomic layer deposition (ALD) in manufacturing a phase change memory device illustrated in FIGS. 1-3, according to example embodiments.

FIG. 4 illustrates a process of forming the phase change layer 66 using the ALD method. In FIG. 4, the phase change layer 66 may be regarded as a GST layer. In addition, after the surface treatment, the substrate 40 may be loaded in a chamber for atomic layer deposition. Also, the temperature of the substrate 40 may be maintained at about 200° C.-about 300° C., and the pressure of the chamber may be maintained at about 0.1 torr-about 10 torr during the atomic layer deposition.

Referring to FIG. 4, in S1, a first source material of the phase change layer 66 may be supplied to a chamber for a predetermined or given period of time. The first source material may be one of a first precursor containing germanium (Ge), a second precursor containing antimony (Sb), and a third precursor containing tellurium (Te).

Figure 11:
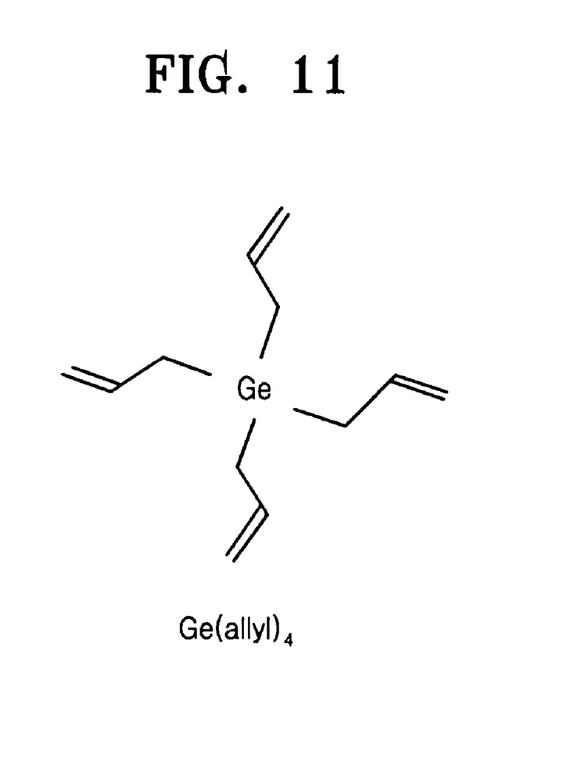
FIGS. 11-13 are diagrams illustrating the chemical structure of precursors supplied as a source material when forming a phase change material using the ALD method, according to example embodiments.
Figure 12:
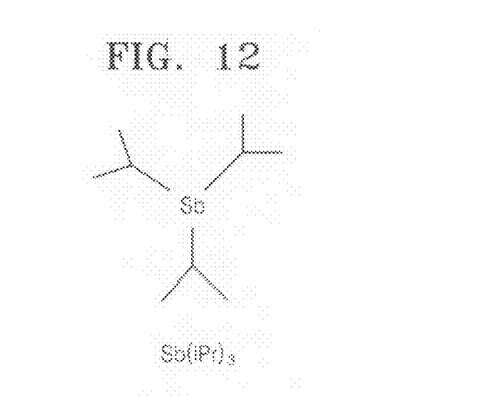
Figure 13:
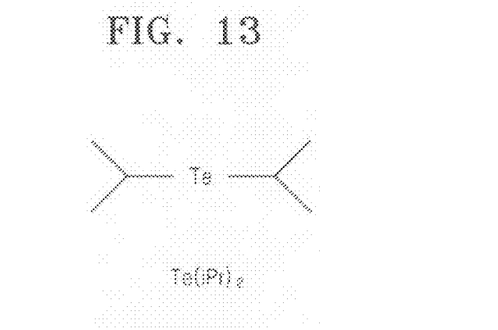

The first through third source materials may be regarded as the first through third precursors for convenience. The first precursor may be Ge(allyl)$_4$ having an alkyl group. The second precursor may be Sb(iPr)$_3$ having an alkyl group. The third precursor may be Te(iPr)$_2$ having an alkyl group. Herein, "iPr" denotes an isopropyl group. The chemical structure of the first precursor may be illustrated in FIG. 11, and the chemical structures of the second and third precursors are illustrated in FIGS. 12 and 13, respectively.

As described above, the first through third precursors all may have an alkyl group, and the surface state of the upper surface of the second insulating interlayer 62 may have a chemical structure to which an alkyl group radical may be easily absorbed by the surface treatment, thus the first through third precursors may be selectively absorbed on the upper surface of the second insulating interlayer 62.

After performing S1, a purge gas may be supplied to the chamber (S2). Argon (Ar) gas may be used as the purge gas. Using the purge gas, the first precursor physically absorbed on the upper surface of the second insulating interlayer 62 may be removed. After performing S2, a reaction gas may be supplied to the chamber. H$_2$ gas may be used as the reaction gas. Plasma may replace the H$_2$ gas to facilitate the reaction. In other words, the phase change layer 66 may be formed using a plasma enhanced ALD method.

After performing S3, a purge gas may be supplied to the chamber (S4). Thus, the H$_2$ gas remaining in the chamber may be discharged to the outside. The purge gas of S4 may be the same as the purge gas of S2. After performing S4, the second source material (the second precursor) may be supplied to the chamber (S5).

Supplying purge gas (S6), supplying reaction gas (S7), and supplying purge gas (S8) may be performed sequentially. S6-S8 may be performed in the same manner as S2-S4, respectively. After performing S8, a third source material (third precursor) may be supplied to the chamber (S9).

Then, supplying purge gas (S10), supplying reaction gas (S11), and supplying purge gas (S12) may be performed sequentially. S10-S12 may be performed in the same manner as S2-S4, respectively. S1-S12 may be counted as one period and repeated until a desired thickness of the phase change layer 66 is obtained (S13). When forming the phase change layer 66 using the ALD method, the first through third source materials (first through third precursors) may be supplied at the same time instead of being supplied at different points of time as above.

For example, first and second source materials (first and second precursors) may be supplied to the chamber at the same time during S1. Second and third source materials (second and third precursors) may be supplied to the chamber at the same time during S5. First through third source materials (first through third precursors) may be supplied to the chamber at the same time during S1. The supplying method of the source material may vary at each period. For example, during one period, source material may be supplied according to S1-S12, and then first and second source materials, second and third source materials, first and third source materials or first through third source materials may be supplied at the same time in one operation during a next period.

Also, among supplying the purge gas, supplying the reaction gas, and supplying the purge gas, which are performed after supplying each source material, supplying of the purge gas for the second time may be omitted. An experiment of forming a GST layer as the phase change layer using the ALD method was performed. In this experiment, the temperature of the substrate was maintained at about 250° C., and about 300 periods of the atomic layer deposition were performed counting S1-S12 as one period.

Figure 14:
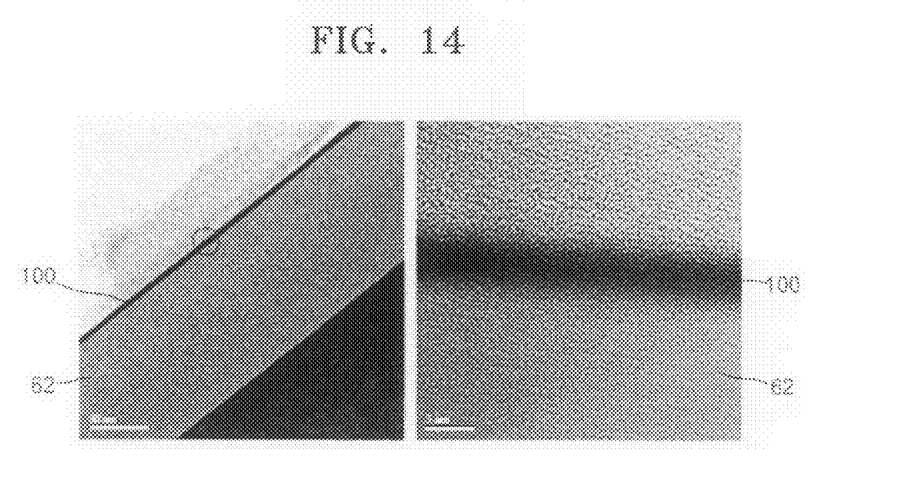
FIG. 14 is a transmission electron microscope (TEM) image of a phase change layer manufactured using the method of manufacturing a phase change memory device illustrated in FIGS. 1-3.
Figure 15:
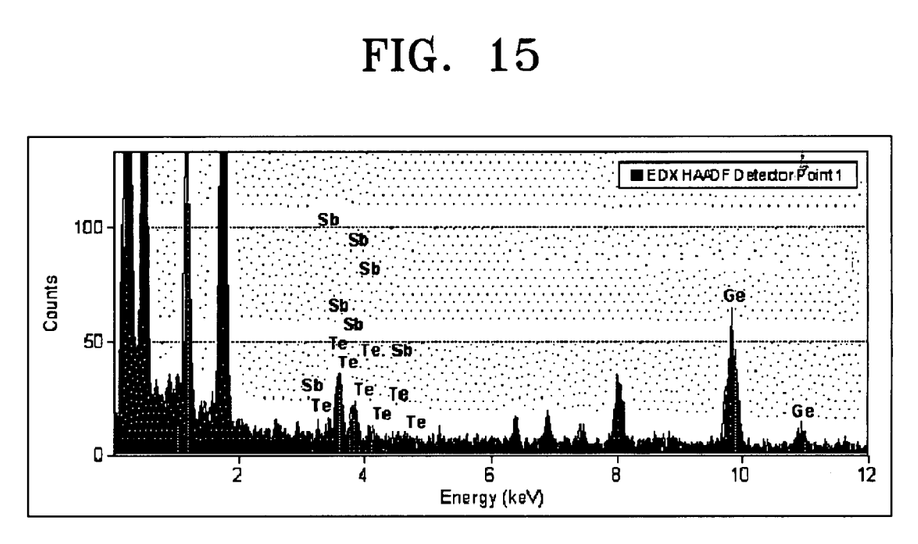
FIG. 15 is a graph illustrating the analysis result of the composition of the phase change layer formed using a transmission electron microscope-energy dispersive X-ray spectroscopy (TEM-EDX)

FIG. 14 illustrates the result of the experiment. Referring to FIG. 14, a phase change layer 100 having a constant thickness may be formed on a second insulating interlayer 62. FIG. 15 illustrates the analysis result of the composition of the phase change layer 100 obtained from the experiment above. The analysis was performed using a TEM-EDX. Referring to FIG. 15, the phase change layer 100 contains Ge, Sb, and Te. Accordingly, the phase change layer 100 of FIG. 14 having a constant thickness, may be a normal GST layer.

Referring to FIG. 3, the phase change layer 66 may be formed on the second insulating interlayer 62 to cover the upper surface of the BEC layer 64 in the PRAM of FIG. 3. In the method of manufacturing a phase change memory device according to example embodiments, the reset current varies according to the formation position of the phase change layer 66. For example, as illustrated in FIG. 16, when the phase change layer 66 fills the via hole h2 and covers a portion of the upper surface of the second insulating interlayer 62, and as illustrated in FIG. 17, when the phase change layer 66 is formed only in the via hole h2, the reset current of a PRAM may be reduced by more than about 50% compared to the reset current of a conventional PRAM having the same structure manufactured by a conventional method.

As described above, according to example embodiments, a phase change memory device may be manufactured by treating a surface of a bottom layer, on which a phase change layer is to be formed, using a reagent before forming the phase change layer. For example, the reagent may be coated on the surface of the bottom layer, for example, as one atomic layer. Using the surface treatment, the surface of the bottom layer may obtain a chemical structure which may more easily react with an alkyl radical.

Accordingly, using the method of forming a phase change memory device according to example embodiments, the source material of the phase change material having an alkyl group may be more easily adhered on the bottom layer when a phase change layer is formed. Also, the ALD method may more easily control the thickness of layers to be stacked. The phase change layer may have a constant thickness. Because the uniformity of the thickness of the phase change layer is not related to the structure of the bottom layer, improved step coverage of the phase change layer may be obtained. Also, due to the characteristics of the ALD method, the phase change layer may be deposited in a nanometer scale, for example, in a via hole h2 illustrated in FIGS. 16 and 17, and thus phase change may occur by a local heat treatment.

Figure 16:
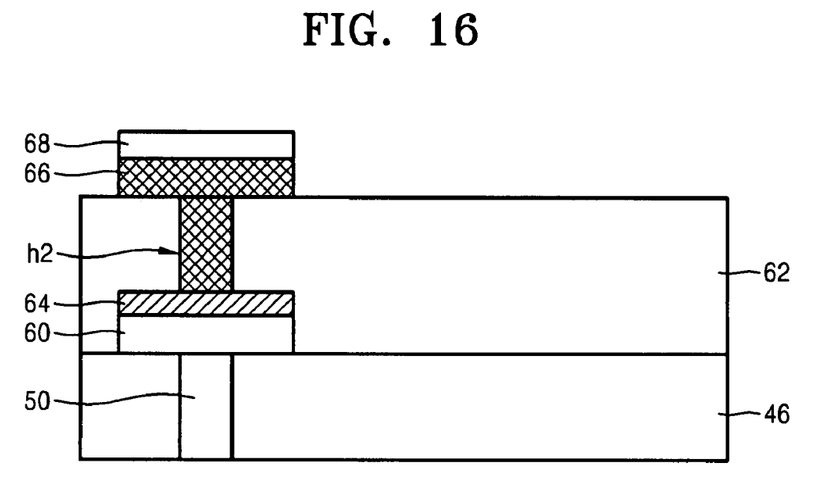
FIGS. 16 and 17 are cross-sectional views illustrating phase change memory devices in which a phase change layer is formed at different locations compared to a phase change memory device illustrated in FIGS. 1-3.
Figure 17:
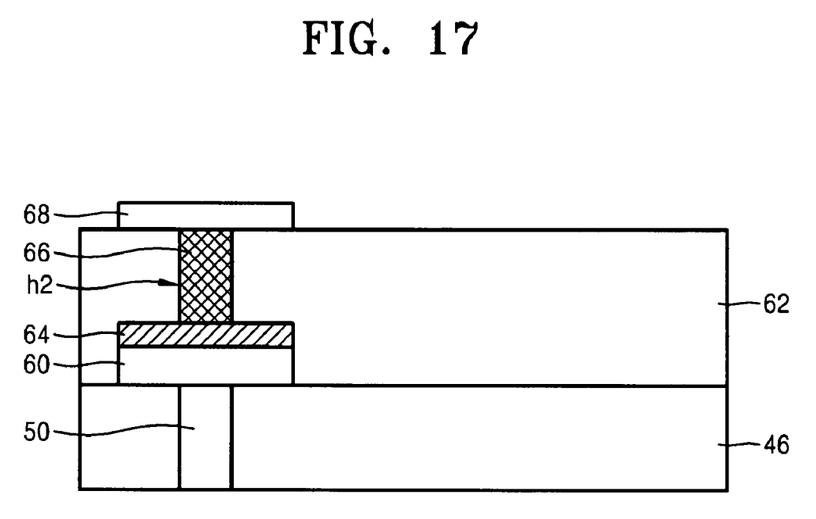

As illustrated in FIGS. 16 and 17, when the phase change layer 66 is formed to fill the via hole h2, the simulation result shows that the reset current may be reduced by about 50% or more. Therefore, using the method of forming a phase change memory device according to example embodiments, the amount of maximum allowable current for a transistor may be reduced, thereby reducing the size of the transistor and increasing the integration degree of the phase change memory device.

While example embodiments have been particularly shown and described with reference to example embodiments thereof, it will be understood by those of ordinary skill in the art that various changes in form and details may be made therein. For example, the locations of the phase change layer may be other than the locations illustrated in FIGS. 3, 16, and 17. Also, the BEC 64 may directly contact the first impurity region A1 without the bottom electrode 60.

In some example embodiments, the phase change layer may include chalcogenide alloys, e.g., germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change layer may include an element in Group VA-antimony-tellurium, e.g., tantalum-antimony-tellurium (Ta—Sb—Te), niobium-antimony-tellurium (Nb—Sb—Te) or vanadium-antimony-tellurium (V—Sb—Te) or an element in Group VA-antimony-selenium, e.g., tantalum-antimony-selenium (Ta—Sb—Se), niobium-antimony-selenium (Nb—Sb—Se) or vanadium-antimony-selenium (V—Sb—Se). Further, the phase change layer may include an element in Group VIA-antimony-tellurium, e.g., tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium, e.g., tungsten-antimony-selenium (W—Sb—Se), molybdenum-antimony-selenium (Mo—Sb—Se) or chrome-antimony-selenium (Cr—Sb—Se).

Although the phase change layer is described above as being formed primarily of ternary phase-change chalcogenide alloys, the chalcogenide alloy of the phase change layer could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example. Thus the scope of example embodiments should be defined not by the example embodiments described above but as defined by the following claims.

What is claimed is:

1. A method of surface treating a phase change layer comprising:
   before forming the phase change layer, forming a coating layer on a surface of a bottom layer on which the phase change layer is to be formed,
   wherein the coating layer has a chemical structure for contributing to the adherence of an alkyl radical to the surface of the bottom layer.

2. The method of claim 1, wherein forming the coating layer includes using a dip coating method or a spin coating method.

3. The method of claim 1, wherein forming the coating layer includes using an ALD method.

4. The method of claim 1, wherein forming the coating layer includes using a material selected from the group of materials represented by $(alkyl)_x(OR)_y(Cl)_z Si$ ($x+y+z=4$, $y \geq 1$) as a reagent.

5. The method of claim 4, wherein the reagent is one selected from the group consisting of diethyldiethoxysilane, diisopropyldimethoxysilane, and diisobutyldimethoxysilane.

6. The method of claim 1, wherein forming the coating layer includes forming one atomic layer.

7. The method of claim 1, before forming the coating layer, further comprising:
   forming a via hole in the bottom layer; and
   filling a conductive plug in the via hole.

8. The method of claim 1, further comprising:
   forming a via hole in the bottom layer before forming the coating layer,
   wherein forming the phase change layer includes filling the phase change layer in the via hole in the bottom layer coated with the coating layer.

9. The method of claim 8, further comprising:
   removing the phase change material layer formed on an upper surface of the bottom layer.

10. A method of manufacturing a phase change memory device comprising:
    forming a bottom electrode on a first insulating interlayer;
    forming a second insulating interlayer, covering the bottom electrode, on the first insulating interlayer;
    exposing an upper surface of the bottom electrode by forming a via hole in the second insulating interlayer;
    forming a bottom electrode contact (BEC) layer in order to fill the via hole;
    performing the method of surface treating the phase change layer according to claim 1; and
    sequentially forming the phase change layer and an upper electrode on the upper surface of the second insulating interlayer.

11. The method of claim 10, further comprising:
    sequentially stacking a gate insulating layer and a gate electrode on a region of a substrate; and
    ion-injecting conductive impurities into the gate electrode to form first and second impurity regions, wherein the substrate, the first and second impurity regions, and the gate electrode form a field effect transistor (FET).

12. The method of claim 11, further comprising:
    forming the first insulating interlayer to cover the field effect transistor on the substrate;
    exposing the first or second impurity region by forming a contact hole in the first insulating interlayer; and
    forming a conductive plug in order to fill the contact hole, wherein the bottom electrode covers an exposed upper surface of the conductive plug.

13. The method of claim 10, wherein forming the phase change layer includes using an atomic layer deposition (ALD) method.

14. The method of claim 10, wherein forming the phase change layer, further comprises:
    supplying at least one of a plurality of source materials of the phase change layer;
    supplying a first purge gas;
    supplying a reaction gas; and
    supplying a second purge gas.

15. The method of claim 14, wherein the reaction gas is $H_2$ gas or plasma.

16. The method of claim 14, wherein the source materials include precursors containing Ge and an alkyl group, precursors containing Sb and an alkyl group, and precursors containing Te and an alkyl group.

17. The method of claim 11, wherein the conductive impurities of the first and second impurity regions are opposite in polarity to those of the impurities doped in the substrate.

* * * * *